(12) United States Patent
Haraguchi et al.

(10) Patent No.: US 6,240,045 B1
(45) Date of Patent: May 29, 2001

(54) SYNCHRONOUS SEMICONDUCTOR INTEGRATED CIRCUIT CAPABLE OF IMPROVING IMMUNITY FROM MALFUNCTIONS

(75) Inventors: Masaru Haraguchi; Tadaaki Yamauchi; Katsumi Dosaka, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/489,933

(22) Filed: Jan. 24, 2000

(30) Foreign Application Priority Data

May 6, 1999 (JP) .................................. 11-125665
Jul. 23, 1999 (JP) .................................. 11-208895

(51) Int. Cl.[7] ........................................ G11C 7/00
(52) U.S. Cl. .................... 365/233; 365/189.01; 365/203; 365/222

(58) Field of Search .................................. 365/233, 222, 365/203, 189.01

(56) References Cited

U.S. PATENT DOCUMENTS 5,402,389 * 3/1995 Flannangan et al. ................. 365/233

FOREIGN PATENT DOCUMENTS 9-153283   6/1997 (JP) .

* cited by examiner

Primary Examiner—Vu A. Le
(74) Attorney, Agent, or Firm—McDermott, Will & Emery

(57) ABSTRACT

A semiconductor memory device converts an automatic precharge signal, which is an asynchronous control signal, to a synchronous signal and inhibits a synchronous control circuit from an operation with respect to an illegal command in response to the converted signal. An internal malfunction with respect to the illegal command can be prevented due to this structure.

10 Claims, 9 Drawing Sheets

SYNCHRONOUS SEMICONDUCTOR INTEGRATED CIRCUIT CAPABLE OF IMPROVING IMMUNITY FROM MALFUNCTIONS

BACKGROUND OF THE INVENTION

1. Field of the Invention

The present invention relates to a semiconductor memory device, and more particularly, it relates to a synchronous semiconductor memory device capturing a command and inputting/outputting data synchronously with an externally input reference clock having a constant cycle.

2. Description of the Prior Art

FIG. 12 is a block diagram showing the structure of an operation control circuit of a conventional synchronous semiconductor memory device. Referring to FIG. 12, a reference clock circuit 1 receives an external reference clock signal extCLK and converts the same to an internal reference clock signal intCLK. A command decoder 2 decodes an external control signal and decides/designates operations of the synchronous semiconductor memory device. A control circuit part 3 receives decode signals from the command decoder 2 and controls internal operations of the synchronous semiconductor memory device.

The operations of the synchronous semiconductor memory device are generally classified into row system operations and column system operations. The row system operations mainly include a row system activating operation for selectively setting a word line high and amplifying the potential difference between a pair of bit lines with a sense amplifier, a refresh operation for rewriting data in a memory cell through a series of operations for activating a row system, setting the word line high and equalizing the pair of bit lines, a precharge operation for setting the word line low and equalizing the pair of bit lines, and the like.

The control circuit part 3 includes a row system activation trigger circuit 4 receiving a row system activation decode signal ACTF from the command decoder 2 and outputting a signal ACT triggering row system activation synchronous with the internal reference clock signal intCLK, a refresh trigger circuit 5 receiving a refresh decode signal REFF from the command decoder 2 and outputting a signal REF triggering a refresh operation synchronous with the internal reference clock signal intCLK, a precharge trigger circuit 6 receiving a precharge decode signal PREF from the command decoder 2 and outputting a signal PRE triggering a precharge operation synchronous with the internal reference clock signal intCLK, an internal RAS signal generation circuit 7 receiving the trigger signals ACT, REF and PRE and activating an internal row system basic signal RAS forming the basis of internal row system operations, and a row system•sense control circuit 8 receiving the internal row system basic signal RAS and controlling fine timings for individual row system operations such as a sense amplifier activation timing, an automatic precharge timing in the refresh operation and the like through an asynchronous delay circuit.

The internal row system basic signal RAS is activated in response to activation of the row system activation trigger signal ACT, and inactivated in response to activation of the precharge trigger signal PRE. In the refresh operation, the row system basic signal RAS is activated in response to activation of the refresh trigger signal REF, and automatically inactivated at a prescribed internal timing. This timing corresponds to an activation timing for a signal S0D output from the row system•sense control circuit 8 for instructing automatic precharge upon termination of a sense operation.

The automatic precharge signal S0D, which is activated in a precharge period, inhibits activation of the row system activation trigger signal ACT and the refresh trigger signal REF.

FIG. 13 is a timing chart showing the operations of the conventional synchronous semiconductor memory device shown in FIG. 12. Referring to FIG. 13, a signal COMMAND indicates a command decided by a combination of control signals externally input in the command decoder 2. With reference to FIG. 13, the synchronous semiconductor memory device executes the refresh operation in response to an external refresh command, and the internal row system basic signal RAS is incorrectly re-activated through a false external row system activation command IR.

Such a command not operation-assured in product specification is hereinafter referred to as an illegal command IR.

At a time T01, the refresh trigger circuit 5 captures data of the refresh decode signal REFF from the command decoder 2 in response to rise of the internal reference clock signal intCLK, and the refresh trigger signal REF goes high. In response to this change of the refresh trigger signal REF to a high level, the internal row system basic signal RAS output from the internal RAS signal generation circuit 7 goes high.

At a time T02, the refresh decoder signal REFF is already at a low level and hence the refresh trigger signal REF goes low in response to rise of the internal reference clock signal intCLK.

At a time T03, the signal S0D instructing starting of automatic precharge goes high. The period between the change of the internal row system basic signal RAS to a high level at the time T01 and termination of the sense operation at the time T03 is mainly designed by previously estimating the period between driving of a word line and termination of detection/amplification of the potential difference between a pair of bit lines by a sense amplifier and defined by the asynchronous delay circuit in the row system•sense control circuit 8. The row system basic signal RAS goes low in response to the instruction by the automatic precharge signal S0D for starting precharge.

At a time T04, a row system activation command (active command) is externally input as the illegal command IR. In response to the illegal command IR, the row system activation decode signal ACTF output from the command decoder 2 goes high. At the time T04, however, the automatic precharge signal S0D is high and hence the row system activation trigger signal ACT is not activated despite rise of the internal reference clock signal intCLK.

At a time T05, the automatic precharge signal S0D goes low to terminate the precharge period in the refresh operation.

The period between starting of the precharge operation at the time T03 and termination of the precharge operation at the time T04 is also designed on the basis of a period previously estimated as necessary for the precharge operation by simulation or the like, i.e., the period required for inactivating the word line and completing equalization of the pair of bit lines. In response to the change of the automatic precharge signal S0D to a low level, further, the row system activation trigger signal ACT is released from inhibition of activation, and activated to a high level. In response to this change of the row system activation trigger signal ACT, the internal row system basic signal RAS goes high again.

Thus, activation of the row system activation trigger signal ACT lags the rise of the internal reference clock signal intCLK. In the control circuit 3 operating synchronously with the clock signal having a high frequency, this delay thereafter causes various malfunctions such as displacement and mismatch of subsequent synchronous operations and the like.

In this case, further, not only the row system operations are reactivated immediately after termination of the precharge operation but also the internal row system basic signal RAS goes high with a noise-like shot depending on the high-level period of the row system activation trigger signal ACT responsive to the illegal command IR. Or, the internal row system basic signal RAS is continuously fixed high until an external precharge command is input.

In general, the word line is driven in response to rise of the internal row system basic signal RAS, and the driving of the word line is terminated in response to fall of the internal row system basic signal RAS.

The pair of bit lines are equalized to the same potential following fall of the word line potential, i.e., through control by previously setting the delay time. The word line and the pair of bit lines are connected with a plurality of memory cells as a matter of course, and have large load capacities inclusive of the capacities of the lines themselves. Therefore, a considerable time decided by the time constants (CR) of the word line and the pair of bit lines is required for charging/discharging the word line and the pair of bit lines having large load capacities. This time is by far longer than the rise and fall times of the internal reference clock signal intCLK. Further, the time required for charging/discharging the word line and the pair of bit lines having large load capacities remarkably varies with each device depending on the fabrication process, the operating temperature and the like.

If the row system operations are re-activated immediately after termination of the precharge operation as described above, it follows that the internal row system basic signal RAS goes high to re-drive the word line before the pair of bit lines equally reach a complete precharge potential together, due to dispersion of the device characteristics, the operating temperature and the like.

In this case, the word line is driven while the pair of bit lines are insufficiently precharged, to destroy data rewritten in the memory cells by the refresh operation. Further, the row system activation trigger signal ACT and the internal row system basic signal RAS activated with delays from rise of the internal reference clock signal intCLK also cause malfunctions or data destruction.

The illegal command IR is not assured in operation in the first place. If a malfunction occurs in the semiconductor memory device due to the illegal command IR, therefore, this malfunction is attributed to a false operation by the user. However, such a possibility may be unavoidable that the illegal command IR is input due to the structure of a system employing the semiconductor memory device or a program.

Providing for such a case, it is general for the provider of the semiconductor memory device to prevent malfunctions against the illegal command IR.

For example, Japanese Patent Laying-Open No. 9-153283 (1997) discloses a conventional synchronous semiconductor memory device having a structure inhibiting acceptance of command data in a refresh operation for coping with input of an illegal command. However, the synchronous semiconductor memory device described in Japanese Patent Laying-Open No. 9-153283 cannot prevent malfunctions against the illegal command IR input at the timing shown in FIG. 13.

When an illegal command instructing illegal row system activation or refresh is externally input immediately before termination of a precharge period or this time overlaps with the rise timing of the internal reference clock signal intCLK, therefore, the conventional synchronous semiconductor memory device having the aforementioned structure disadvantageously causes destruction of data stored in memory cells, a malfunction of the internal row system basic signal RAS, or various bad influences exerted by such malfunction.

SUMMARY OF THE INVENTION

An object of the present invention is to provide a synchronous semiconductor memory device preventing an internal row system basic signal from re-activation against an illegal command in a refresh operation.

Another object of the present invention is to provide a synchronous semiconductor memory device capable of preventing a malfunction against an illegal command immediately before termination of a period of automatic precharge asynchronously executed in a refresh operation.

Still another object of the present invention is to provide a synchronous semiconductor memory device capable of preventing a malfunction resulting from the time difference between an asynchronous control signal and a synchronous control signal when synchronous control and asynchronous control are combined.

Briefly stated, the present invention is directed to a synchronous semiconductor memory device comprising a reference circuit, a command decoder, a synchronous control circuit, an asynchronous control circuit, an inhibit circuit and a storage circuit.

The reference circuit receives an external reference clock signal and outputs an internal reference clock signal. The command decoder outputs a decode signal instructing a prescribed internal operation in response to an external control signal.

The synchronous control circuit receives the decode signal and the internal reference clock signal and outputs a synchronous control signal activated synchronously with the internal reference clock signal and inactivated in response to an asynchronous control signal.

The asynchronous control circuit outputs the asynchronous control signal activated asynchronously with the internal reference clock signal. The asynchronous control circuit includes an asynchronous delay circuit for generating the asynchronous control signal by delaying the synchronous control signal by a prescribed period.

The inhibit circuit receives the asynchronous control signal and the internal reference clock signal and converts the asynchronous control signal to be synchronous with the internal reference clock signal, thereby generating an inhibit signal inhibiting activation of the synchronous control signal. The storage circuit is controlled in response to the synchronous control signal and the asynchronous control signal for transmitting/receiving stored data to/from outside the synchronous semiconductor memory device.

According to another aspect of the present invention, a synchronous semiconductor memory device comprises a plurality of dynamic memory cells, a reference clock circuit, a refresh command decoder, a row system activation command decoder, a refresh trigger circuit, a row system activation trigger circuit, an internal row system basic signal generation circuit, an asynchronous control circuit, and a trigger output inhibit circuit.

The plurality of dynamic memory cells are arranged in a plurality of rows and a plurality of columns. The reference clock circuit receives an external reference clock signal and outputs an internal reference clock signal. The refresh command decoder outputs a refresh decode signal instructing a refresh operation for the plurality of memory cells in response to an external control signal.

The row system activation command decoder outputs a row system activation decode signal instructing a row system activating operation including row selection of the plurality of memory cells.

The refresh trigger circuit receives the refresh decode signal and the internal reference clock signal and outputs a refresh trigger signal triggering starting of the refresh operation. The row system activation trigger circuit receives the row system activation decode signal and the internal reference clock signal and outputs a row system activation trigger signal triggering starting of a row system activating operation. The internal row system basic signal generation circuit receives the refresh trigger signal and the row system activation trigger signal and outputs an internal row system basic signal activated in response to activation of at least either the refresh trigger signal or the row system activation trigger signal.

The asynchronous control circuit outputs an asynchronous control signal activated asynchronously with the internal reference clock signal. The asynchronous control circuit includes an asynchronous delay circuit for generating the asynchronous control signal by delaying the internal row system basic signal by a prescribed period.

The trigger output inhibit circuit inhibits activation of the refresh trigger signal and the row system activation trigger signal in response to an active state of a signal obtained by converting the asynchronous control signal to be synchronous with the internal reference clock signal in the refresh operation.

Accordingly, a principal advantage of the present invention resides in that the asynchronous control signal obtained by asynchronously delaying the internal row system basic signal is synchronized with the reference clock signal for inhibiting the trigger circuit from outputting the trigger signal with the synchronized converted signal, and hence the internal row system basic signal can be prevented from a malfunction against an illegal command such as a row system activation command or a refresh command input in the refresh operation.

Another advantage of the present invention resides in that the conversion circuit converts the asynchronous automatic precharge signal to a synchronous signal for inhibiting the trigger circuit from outputting the trigger signal with the converted signal, and hence data destruction or a malfunction of the row system basic signal can be prevented when an illegal command is supplied not only during a precharge period but also immediately before termination of the precharge operation and in superposition on a rise timing of the internal reference clock signal.

Still another advantage of the present invention resides in that it is possible to prevent a malfunction caused by an illegal command resulting from the combination of the synchronous control circuit and the asynchronous control circuit.

A further advantage of the present invention resides in that a malfunction caused by an illegal command is prevented by the circuit generating the trigger signal instructing starting of the internal operation after decoding the illegal command and unnecessary operations caused by the illegal command can be minimized without delaying acceptance of a normal command.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
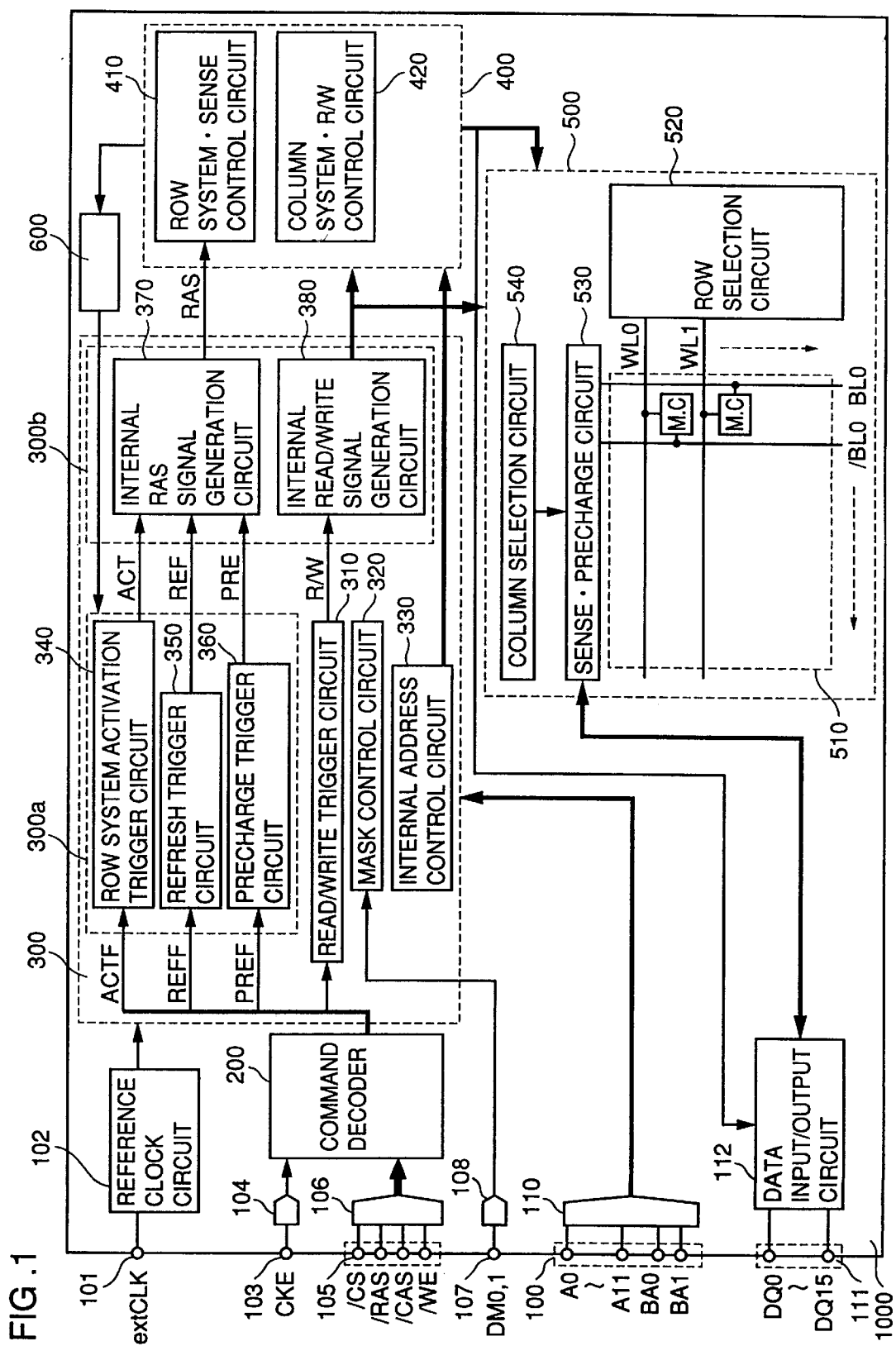
FIG. 1 is a block diagram showing the structure of an SDRAM according to a first embodiment of the present invention.

FIG. 1 is a block diagram showing the structure of an SDRAM (synchronous dynamic random access memory) 1000 according to a first embodiment of the present invention.

The SDRAM 1000 includes a reference clock terminal 101 receiving an external reference clock signal extCLK, a reference clock circuit 102 receiving the external reference clock signal extCLK input from the reference clock terminal 101 and outputting an internal reference clock signal intCLK forming the basis of various operations in the SDRAM 1000, a CKE terminal 103 receiving a signal CKE instructing the SDRAM 1000 to enable acceptance of external input of control signals in the SDRAM 1000, a CKE buffer 104 capturing and transmitting the signal CKE in the SDRAM 1000, a command terminal part 105 receiving various external control signals, a command buffer 106 capturing and transmitting the various control signals input from the command terminal part 105 in the SDRAM 1000, a mask data terminal 107 receiving mask data signals DM0 and DM1 instructing mask operations of data inputs/outputs from corresponding data input/output terminals respectively, a mask data buffer 108 capturing and transmitting the signals DM0 and DM1 in the SDRAM 1000, an address terminal 109 receiving external address signals A0 to A11 and bank address signals BA0 and BA1, an address buffer 110 capturing and transmitting the address signals A0 to A11 and the bank address signals BA0 and BA1 in the SDRAM 1000, a data terminal 111 inputting/outputting data DQ0 to DQ15, and a data input/output circuit 112 controlling data input/output operations synchronous with the external reference clock signal extCLK through the data terminal 111.

The SDRAM 1000 further includes a command decoder 200 receiving the outputs of the CKE buffer 104 and the command buffer 106 and determining an operation command supplied to the SDRAM 1000 by the combination of the externally input control signals, a synchronous control circuit 300 receiving decode signals decoded by the command decoder 200 and the internal reference clock signal intCLK and outputting a synchronous control signal controlling internal operations of the SDRAM 1000 synchronously with the internal reference clock signal intCLK, an asynchronous control circuit 400 receiving the synchronous control signal and outputting an asynchronous control signal controlling the internal operations of the SDRAM 1000 asynchronously with the reference clock signal intCLK, a memory part 500 having a plurality of memory cells controlled by the synchronous control signal or the asynchronous control signal and forming a main storage part of the SDRAM 1000, and an inhibit circuit 600 converting the asynchronous control signal to be synchronous with the internal reference clock signal intCLK and inhibiting activation of the synchronous control signal in response to the synchronized converted signal.

The numbers of address signals A0 to A11, the bank address signals BA0 and BA1, the data signals DQ0 to DQ15 and the mask data signals DM0 and DM1 are not particularly restricted to the illustrated ones but decided in response to the type, the structure, the capacity etc. of the semiconductor memory device.

The memory part 500 includes a memory cell array 510 including dynamic memory cells MC arranged in a plurality of rows and a plurality of columns, a plurality of word lines WLi (i=0, 1, 2, . . .) connected with the plurality of memory cells MC in common along the row direction, and pairs of bit lines BLi and/BLi (i=0, 1, 2, . . .) connected with the plurality of memory cells MC in common along the column direction.

The memory part 500 further includes a row selection circuit 520 selecting the word lines WLi in response to the address signals A0 to A11, a sense•precharge circuit 530 including a sense amplifier sensing/amplifying small potential differences responsive to data held in the memory cells MC appearing on the pairs of bit lines BLi and/BLi and an equalize circuit equally setting the potential differences between the pairs of bit lines BLi and/BLi constant, and a column selection circuit 540 selectively connecting the pairs of bit lines BLi and/BLi with a data line.

The synchronous control circuit 300 includes a row system trigger circuit 300a receiving the decode signals from the command decoder 200 and outputting signals triggering row system operations synchronously with the internal reference clock signal intCLK, a read/write trigger circuit 310 outputting a signal R/V triggering column system operations, particularly an operation for reading/writing data from/in the memory part 500, a mask control circuit 320 receiving the mask data signals DM0 and DM1 from the mask data buffer 108 and inhibiting read/write operations (input/output) from the data input/output terminals corresponding to the mask data signals DM0 and DM1 respectively, an internal address control circuit 330 internally automatically generating a counter address signal in a refresh operation and switching the counter address signal and the address signals A0 to A11 from the address buffer 110, and an internal basic signal generation circuit 300b receiving the various trigger signals output from the row system trigger circuit 300a and the read/write trigger signal R/W and activating a control signal forming the basis of the internal operations of the SDRAM 1000 synchronously with the internal reference clock signal intCLK.

The row system trigger circuit 300a includes a row system activation trigger circuit 340 receiving a row system activation decode signal ACTF from the command decoder 200 and outputting a signal ACT triggering row system activation synchronous with the internal reference clock signal intCLK, a refresh trigger circuit 350 receiving a refresh decode signal REFF from the command decoder 200 and outputting a signal REF triggering the refresh operation synchronous with the internal reference clock signal intCLK, and a precharge trigger circuit 360 receiving a precharge decode signal PREF from the command decoder 200 and outputting a signal PRE triggering a precharge operation synchronous with the internal reference clock signal intCLK.

The internal basic signal generation circuit 300b includes an internal RAS signal generation circuit 370 mainly outputting a basic signal RAS for the row system operations, and an internal read/write signal generation circuit 380 mainly outputting a basic signal for column system operations.

The asynchronous control circuit 400 includes a row system•sense control circuit 410 receiving the basic signal RAS for the row system operations output from the internal RAS signal generation circuit 370, asynchronously delaying the signal RAS by an asynchronous delay circuit and outputting a signal controlling various timings of the row system operations such as a word line drive timing, a sense amplifier activation timing, a timing for equalizing (precharging) the pairs of bit lines BLi and/BLi and the like, for example, and a column system•R/W control circuit 420 asynchronously delaying the basic signal for the column system operations output from the internal read/write signal generation circuit 380 and controlling the column system operations.

In the SDRAM 1000, most of the column system operations are controlled synchronously with the internal reference clock signal intCLK, dissimilarly to an asynchronous semiconductor memory device simply called a DRAM. Therefore, the number of the operations controlled by the column system•R/W control circuit 420 is extremely smaller than that of the operations controlled by the row system•sense control circuit 410.

FIGS. 2A to 2D are circuit diagrams showing the structures of first to fifth latch circuits employed on various positions in the first embodiment of the present invention. Each of these latch circuits captures or holds input data in a constant cycle in response to rise or fall of a clock signal CK.

Figure 2A:
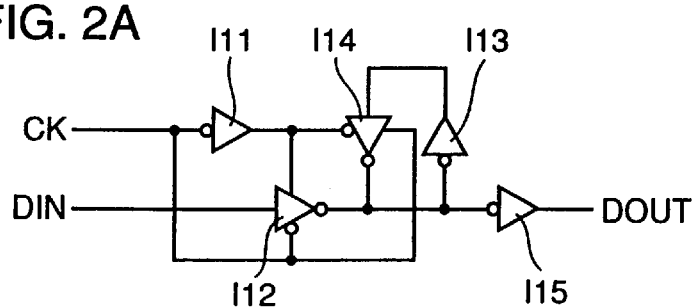
FIGS. 2A to 2D are circuit diagrams showing the structures of first to fifth latch circuits employed on various positions in the first embodiment of the present invention.

FIG. 2A shows a hold circuit, hereinafter referred to as an LL circuit, capturing input data DIN when the clock signal CK is low while inhibiting capture of the input data DIN and holding the already captured logic (the input data DIN) when the clock signal CK is high.

The LL circuit includes an invertor I11 inverting the clock signal CK, a clocked invertor I12 operating as an invertor when the clock signal CK is low for inverting and outputting the input data DIN, an invertor I13 receiving, inverting and outputting the output of the clocked invertor I12, a clocked invertor I14 receiving the output of the invertor I13 and operating as an invertor when the clock signal CK is high, and an invertor I15 receiving the outputs of the clocked invertors I12 and I14 and outputting output data DOUT of the LL circuit.

Figure 2B:
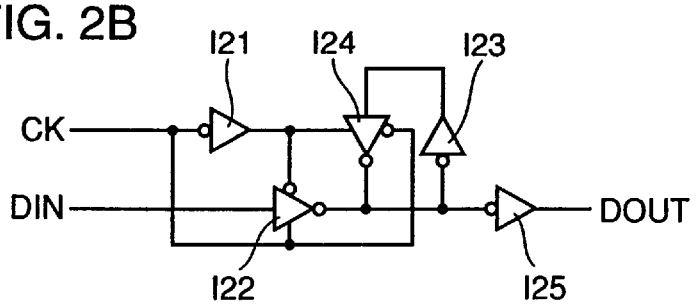

FIG. 2B shows a hold circuit, hereinafter referred to as an LH circuit, capturing input data DIN when the clock signal CK is high while inhibiting capture of the input data DIN and holding the already captured logic (the input data DIN) when the clock signal CK is low.

The LH circuit includes an invertor I21 inverting the clock signal CK, a clocked invertor I22 operating as an invertor when the clock signal CK is high for inverting and outputting the input data DIN, an invertor I23 receiving, inverting and outputting the output of the clocked invertor I22, a clocked invertor I24 receiving the output of the invertor I23 and operating as an invertor when the clock signal CK is low, and an invertor I25 receiving the outputs of the clocked invertors I22 and I24 and outputting output data DOUT of the LH circuit.

Figure 2C:
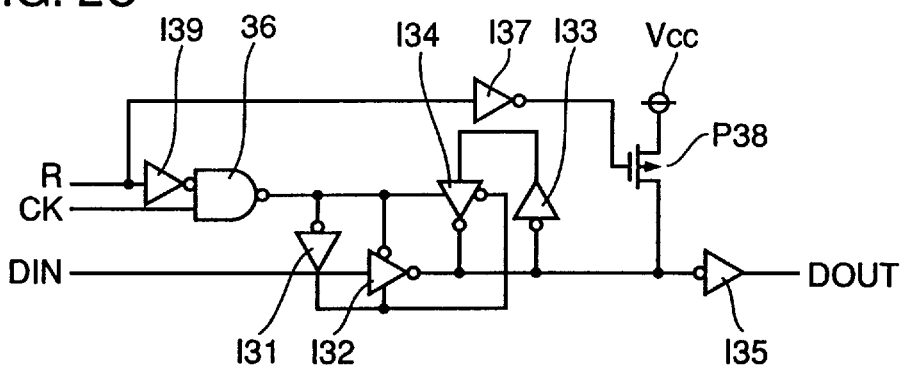

FIG. 2C shows a hold circuit, hereinafter referred to as an RLH circuit, capturing input data DIN when the clock signal CK is high, inhibiting capture of the input data DIN while holding the already captured logic (the input data DIN) when the clock signal CK is low, and inhibiting capture of the input data DIN regardless of the clock signal CK and fixing an output DOUT low when a reset signal R is high.

The RLH circuit includes invertors I37 and I39 receiving, inverting and outputting the reset signal R, a two-input NAND circuit 36 receiving the output of the invertor I39 and the clock signal CK, an invertor I31 inverting an output of the two-input NAND circuit 36, a clocked invertor I32 operating as an invertor when the clock signal CK is high while the reset signal R is low for inverting and outputting the input data DIN, an invertor I33 receiving, inverting and outputting the output of the clocked invertor I32, a clocked invertor I34 receiving the output of the invertor I33 and operating as an invertor when the clock signal CK is low, an invertor I35 receiving the outputs of the clocked invertors I32 and I34 and outputting the output data DOUT of the RLH circuit, and a reset P-channel transistor P38 connected between a power supply potential Vcc and an input node of the invertor I35 for receiving the output of the invertor I37 in its gate.

Figure 2D:
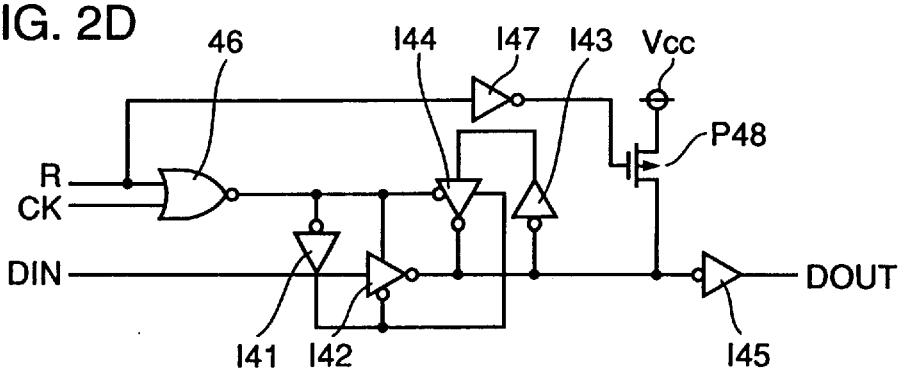

FIG. 2D shows a hold circuit, hereinafter referred to as an RLL circuit, capturing input data DIN when the clock signal CK is high, inhibiting capture of the input data DIN while holding the already captured logic when the clock signal CK is high, and inhibiting capture of the input data DIN regardless of the state of the clock signal CK and fixing an output DOUT low when a reset signal R is high.

The RLL circuit includes an invertor I47 receiving, inverting and outputting the reset signal R, a two-input NOR circuit 46 receiving the reset signal R and the clock signal CK, an invertor I41 inverting an output of the two-input NOR circuit 46, a clocked invertor I42 operating as an invertor when the clock signal CK is low while the reset signal R is low for inverting and outputting input data DIN, an invertor I43 receiving, inverting and outputting the output of the clocked invertor I42, a clocked invertor I44 receiving the output of the invertor I43 and operating as an invertor when the clock signal CK is high, an invertor I45 receiving the outputs of the clocked invertors I42 and I44 and outputting output data DOUT of the RLL circuit, and a reset P-channel transistor P48 connected between a power supply potential Vcc and an input node of the invertor I45 for receiving the output of the invertor I47 in its gate.

Figure 3:
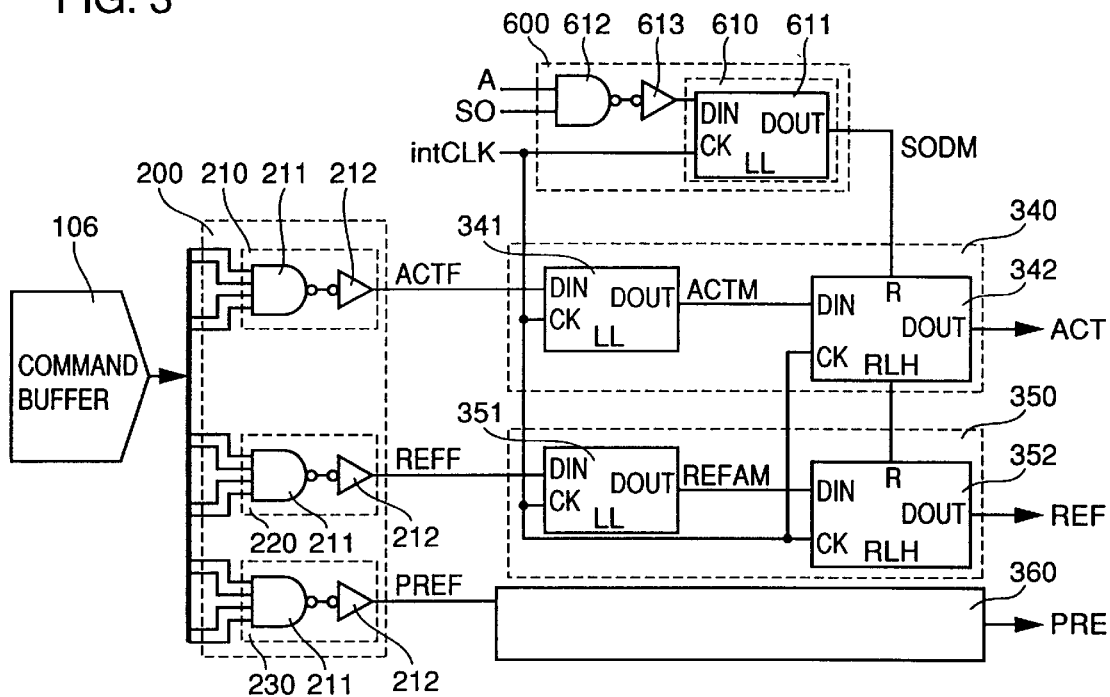
FIG. 3 is a block diagram showing the structures of a command decoder, a row system activation trigger circuit, a refresh trigger circuit and a trigger output inhibit circuit shown in FIG. 1.

FIG. 3 is a block diagram showing the structures of the command decoder 200, parts of the row system trigger circuit 300a mainly contributing to activation of the row system basic signal RAS, i.e., the row system activation trigger circuit 340, the refresh trigger circuit 350 and the precharge trigger circuit 360, and the trigger output inhibit circuit 600.

The command decoder 200 includes a row system activation command decoder 210 receiving the various control signals captured by the command buffer 106 in the SDRAM 1000, decoding a row system activation command and outputting the row system activation decode signal ACTF, a refresh decoder 220 decoding a refresh command and outputting the refresh decode signal REFF, and a precharge decoder 230 decoding a precharge command and outputting the precharge decode signal PREF.

The row system activation command decoder 210, the refresh command decoder 220 and the precharge decoder 230 include NAND circuits 211 decoding the various control signals, and invertors 212 inverting outputs of the NAND circuits 211 and drive-outputting the decode signals, for example, although not restricted in particular. Invertors are provided between inputs of the NAND circuit 211 and the output of the command buffer 106 to correspond to various commands based on a predetermined truth table of external control signals ext/RAS and ext/CAS. However, FIG. 3 omits these invertors for simplifying the illustration.

The row system activation trigger circuit 340 includes an LL circuit 341 receiving the row system activation decode signal ACTF from the row system activation command decoder 210 as an input DIN and the internal reference clock signal intCLK as a clock signal CK and outputting an output signal ACTM, and an RLH circuit 342 receiving the output signal ACTM from the LL circuit 341 as an input DIN, the internal reference clock signal intCLK as a clock signal CK and an inhibit signal S0DM from the trigger output inhibit circuit 600 as the reset signal R and outputting the row system activation trigger signal ACT.

The refresh trigger circuit 350 includes an LL circuit 351 receiving the refresh decode signal REFF from the refresh command decoder 220 as an input DIN and the internal reference clock signal intCLK as a clock signal CK and outputting an output signal REFM, and an RLH circuit 352 receiving the output signal REFM from the LL circuit 351 as an input DIN, the internal reference clock signal intCLK as a clock signal CK and the inhibit signal S0DM from the trigger output inhibit circuit 600 as the reset signal R and outputting the refresh trigger signal REF.

The precharge trigger circuit 360 has such a structure that the RLH circuit 342 or 352 of the row system activation trigger circuit 340 or the refresh trigger circuit 350 is changed to an LH circuit.

The trigger output inhibit circuit 600 includes a two-input NAND circuit 612 receiving a signal S0, one of asynchronous control signals output from the asynchronous control circuit 400, indicating a precharge period upon termination of a sense operation and a signal SA indicating a refresh period, an invertor 613 inverting an output of the two-input NAND circuit 612, and an LL circuit 611 receiving an output of the invertor 613 as an input DIN and the internal reference clock signal intCLK as a clock signal CK and outputting the output signal S0DM.

The output of the invertor 613 is equivalent to an automatic precharge signal S0D instructing automatic precharge in the refresh period. Referring to FIG. 3, the trigger output inhibit circuit 600 is provided with the two-input NAND circuit 612 and the invertor 613, which can alternatively be incorporated into the row system•sense control circuit 410. The LL circuit 611 corresponds to a conversion circuit 610 converting the asynchronous control signal S0D to the synchronous control signal S0DM.

Figure 4:
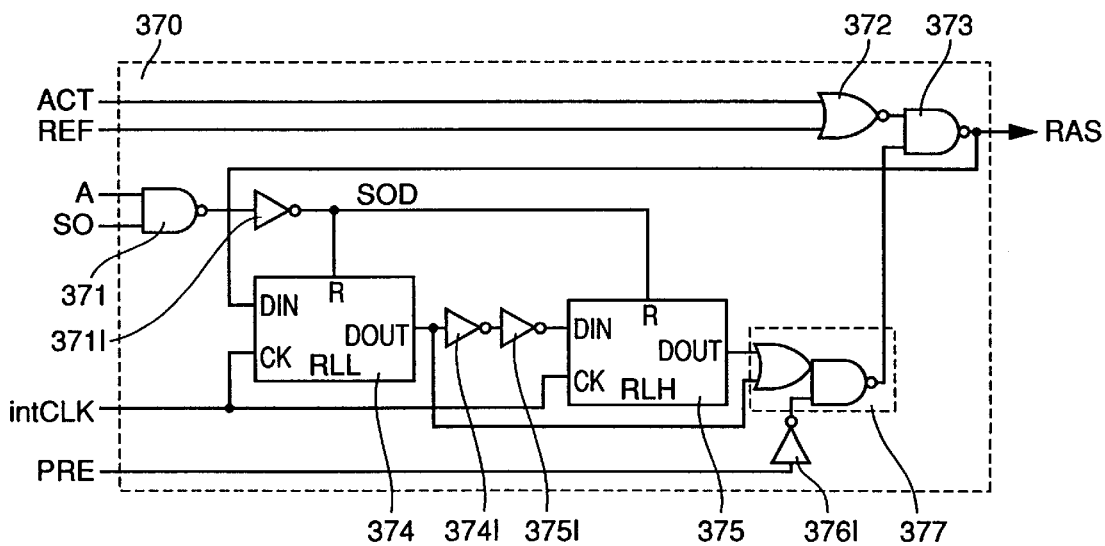
FIG. 4 is a circuit diagram showing the structure of an internal row system basic signal generation circuit shown in FIG. 1.

FIG. 4 is a circuit diagram showing the structure of the internal RAS signal generation circuit 370 shown in FIG. 1.

The internal RAS signal generation circuit 370 includes a two-input NAND circuit 371 receiving the signal S0 indicating a sense completion timing and the precharge period output from the row system•sense control circuit 410 and a signal SA remaining high in a refresh mode, an invertor 371I receiving and inverting an output of the NAND circuit 371 and outputting a signal equivalent to the automatic precharge signal S0D, a two-input NOR circuit 372 receiving the row system activation trigger signal ACT output from the row system activation trigger circuit 340 and the refresh trigger signal REF output from the refresh trigger circuit 350, a two-input NAND circuit 373 receiving an output of the two-input NOR circuit 372 as one input and outputting the signal RAS forming the basis of the series of row system operations, an RLL circuit 374 receiving the internal row system basic signal RAS as an input DIN, the internal reference clock signal intCLK as a clock signal CK and the output of the invertor 371I as the reset signal R, an invertor 374I receiving, inverting and outputting an output of the RLL circuit 374, an invertor 375I further inverting and outputting the output of the invertor 374I, an RLH circuit 375 receiving the output of the invertor 375I as an input DIN, the internal reference clock signal intCLK as a clock signal CK and the output of the invertor 371I as the reset signal R, an invertor 376I receiving, inverting and outputting the precharge trigger signal PRE output from the precharge trigger circuit 360, and a logic circuit 377 receiving the outputs of the invertor 376I, the RLL circuit 374 and the RLH circuit 375 and outputting a signal instructing inactivation of the row system basic signal RAS.

The RLL circuit 374 and the RLH circuit 375 are circuits for maintaining the state of the row system basic signal RAS once activated, i.e., going high. In the refresh operation, the signal S0D resets the RLL circuit 374 and the RLH circuit 375 upon completion of the sense operation and hence the row system basic signal RAS is inactivated, i.e., goes low.

Figure 5:
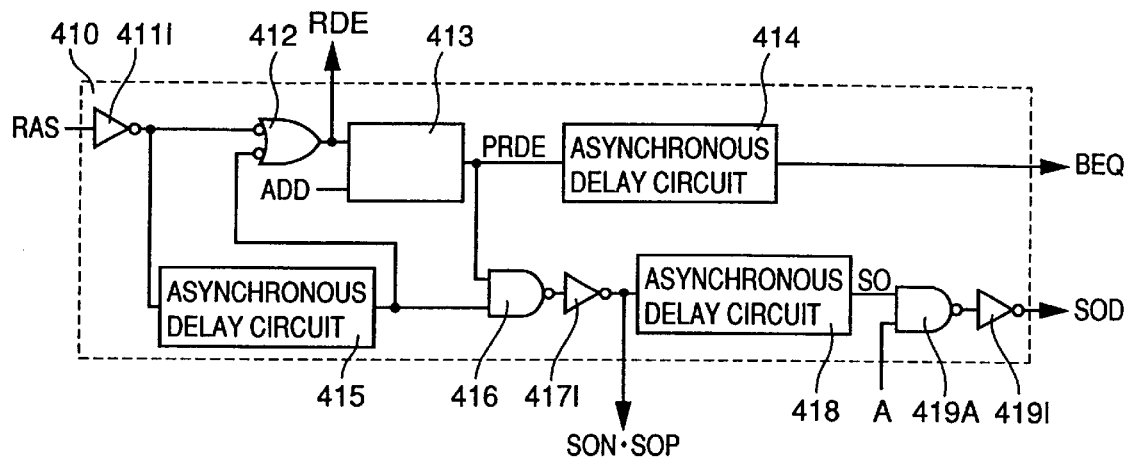
FIG. 5 is a circuit diagram showing a row system•sense control circuit shown in FIG. 1.

FIG. 5 is a block diagram showing the structure of the row system•sense control circuit 410 included in the asynchronous control circuit 400. The row system•sense control circuit 410 includes an invertor 411I receiving, inverting and outputting the internal row system basic signal RAS activated synchronously with the internal reference clock signal intCLK, an asynchronous delay circuit 415 delaying the output of the invertor 411I asynchronously with the internal reference clock signal intCLK, a two-input NAND circuit 412 receiving the outputs of the invertor 411I and the asynchronous delay circuit 415, having an output changed in response to output change of the asynchronous delay circuit 415 when the signal RAS goes high and changed in response to output change of the asynchronous delay circuit 415 when the signal RAS goes low, and outputting a signal RDE controlling a timing for activating the row selection circuit 520, a predecoder 413 controlling a selection timing for a block in the memory cell array 510 in response to the output of the two-input NAND circuit 412 and an address signal ADD output from the internal address control circuit 330, an asynchronous delay circuit 414 delaying an output of the predecoder 413 and outputting an equalize signal BEQ controlling an equalize timing for the pair of bit lines BLi and/BLi in consideration of the timing for block selection, a two-input NAND circuit 416 receiving the outputs of the asynchronous delay circuit 415 and the predecoder 413, an invertor 417I inverting an output of the two-input NAND circuit 416 and outputting sense amplifier activation signals S0N and S0P for controlling an activation timing for the sense amplifier when a row address of a memory cell is selected, an asynchronous delay circuit 418 receiving the sense amplifier activation signals S0N and S0P and outputting the signal S0 indicating completion of the sense operation and the precharge period in consideration of the period between starting of sensing and termination of the sense operation, i.e., an operation for sensing and amplifying the potential difference between the pair of bit lines BLi and/BLi, a two-input NAND circuit 419A receiving the signal S0 and the signal SA indicating the refresh period, and an invertor 419I inverting an output thereof and outputting the automatic precharge signal S0D in the refresh operation.

Figure 6A:
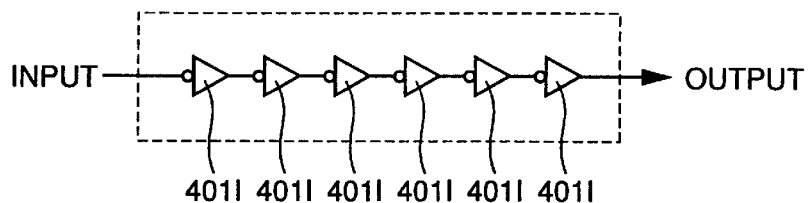
FIGS. 6A and 6B are circuit diagrams of first and second exemplary structures of an asynchronous delay circuit shown in FIG. 5 respectively.
Figure 6B:
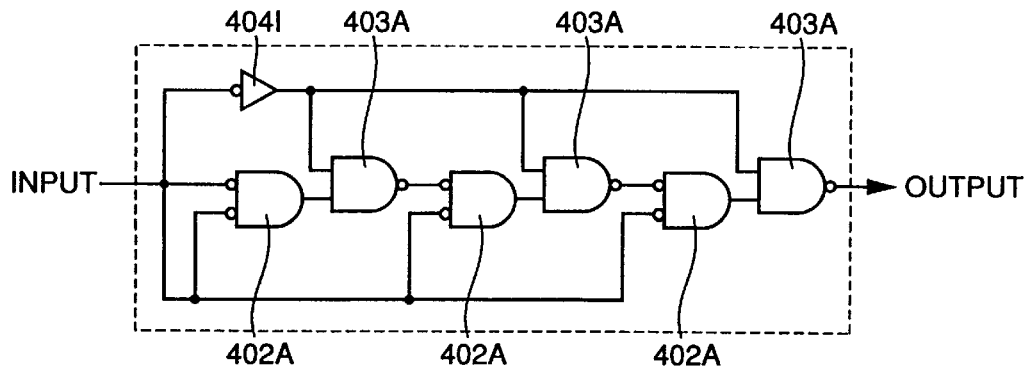

FIGS. 6A and 6B are circuit diagrams showing examples of each of the asynchronous delay circuits 414, 415 and 418 shown in FIG. 5. FIG. 6A is a circuit diagram showing a first exemplary structure, and FIG. 6B is a circuit diagram showing a second exemplary structure. The asynchronous delay circuit, simply delaying an input signal by a prescribed period without in synchronization with the reference clock signal intCLK, may have any of various structures.

FIG. 6A shows the most general asynchronous delay circuit having six invertors 401I serially connected in order. In the structure shown in FIG. 6A, change of an input signal from a high level to a low level or from a low level to a high level is transmitted to an output signal with a delay by the delay stage (six) of the invertors 401I. In this structure, the delay time can be set at desire by adjusting the number of the invertors 401I or the size of transistors forming the invertors 401I.

FIG. 6B shows such a structure that two-input NOR circuits 402A each regularly receiving an input signal in a first input and two-input NAND circuits 403A each regularly receiving a signal obtained by inverting the input signal through an invertor 404I in a first input are alternately connected to successively receive second inputs respectively.

In the structure shown in FIG. 6B, change of the input signal from a high level to a low level is transmitted as an output signal with a delay by the delay stage (six) corresponding to the number of the NOR circuits 401A and the NAND circuits 403A.

However, change of the input signal from a low level to a high level is transmitted to the output signal with a delay by the number (two) of the final-stage NOR circuit 401A and the final-stage NAND circuit 403A, so that the delay time automatically changes on the leading edge and the trailing edge of the input signal.

The asynchronous control circuit 400 employs the asynchronous delay circuits such as those shown in FIGS. 6A and 6B or still another asynchronous delay circuit delaying only rise of an input signal, for adjusting various control timings.

Operations are now described.

Figure 7A:
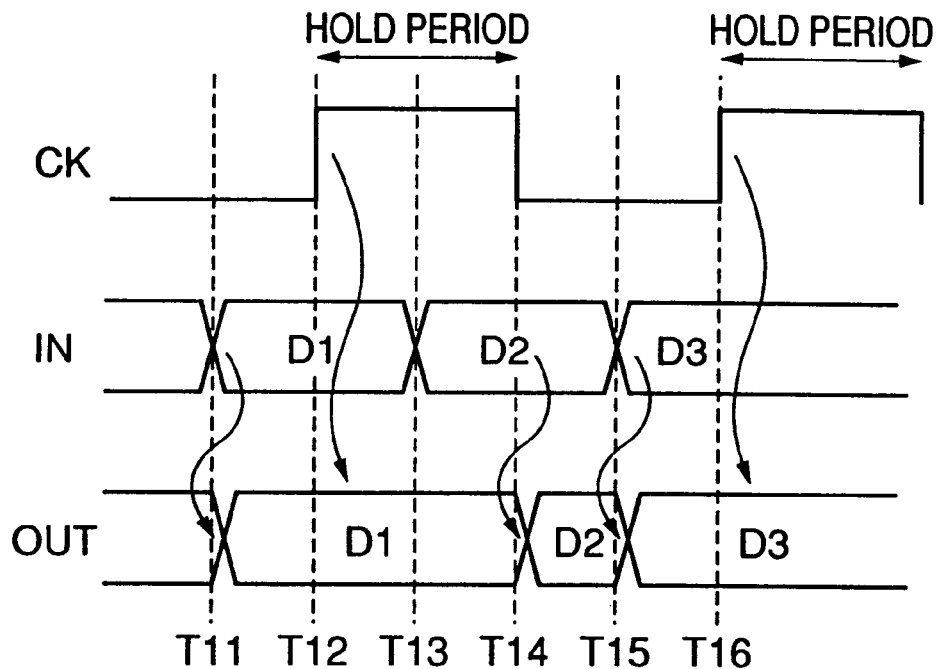
FIGS. 7A and 7B are timing charts showing operations of the latch circuits shown in FIGS. 2A and 2B respectively.
Figure 7B:
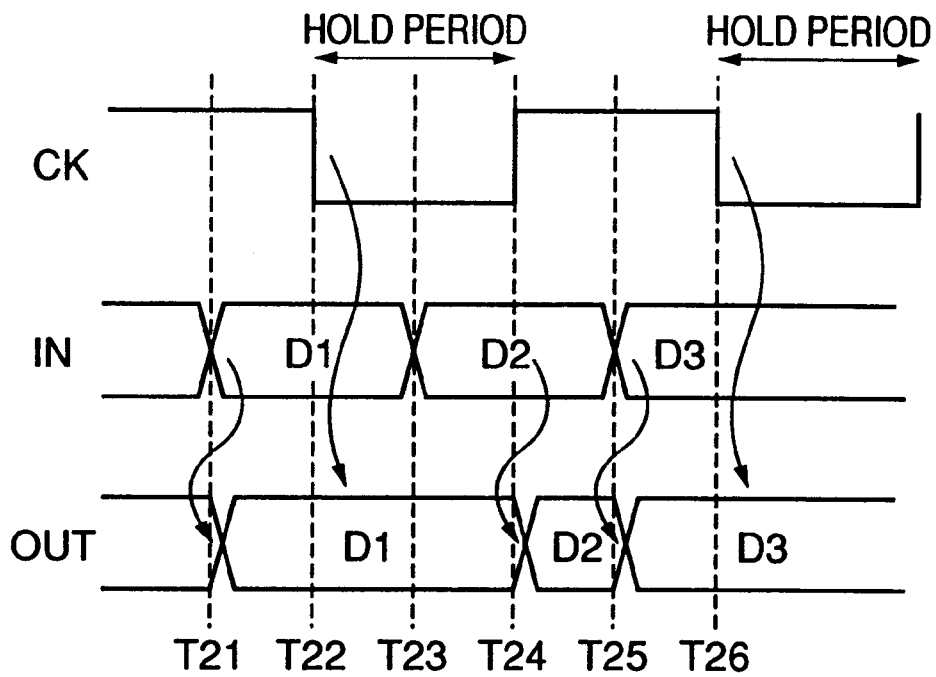

FIGS. 7A and 7B are timing charts showing operations of the LL circuit shown in FIG. 2A and the LH circuit shown in FIG. 2B respectively. Referring to each of FIGS. 7A and 7B, it is assumed that the input data DIN changes to states D1, D2 and D3, and the following description is made on how the output data DOUT changes with respect to the input data DIN.

First, the LL circuit is described with reference to FIG. 7A. At a time T11, the input data DIN changes to D1, and the clocked invertor I12 operates as an invertor to capture and invert the input data D1 since the clock signal CK is low. Further, the invertor I15 inverts the output of the clocked invertor I12, and the LL circuit outputs D1 as the output data DOUT.

At a time T12, the clock signal CK goes high to inhibit the invertor operation of the clocked invertor I12 as well as capture of the input data DIN. The clocked invertor I14 in turn operates as an invertor, and a feedback circuit formed by the clocked invertor I14 and the invertor I13 defines a hold part of the LL circuit for maintaining the state of the output data DOUT corresponding to the input data DIN captured during the invertor operation of the clocked invertor I12, i.e., the state D1.

Also when the input data DIN changes from D1 to D2 at a time T13, therefore, the output data DOUT remains in the state D1.

At a time T14, the clock signal CK goes low, and the clocked invertor I12 starts the invertor operation again and captures the input data DIN already changing to D2. At the same time, the clocked invertor I14 is inhibited from the invertor operation and the feedback of the hold part is interrupted. Therefore, the output data DOUT changes to D2 in response to the input data D2. At a time T15, the input data DIN changes to D3, the clocked invertor I12 captures the data D3 and the output data DOUT changes to D3 since the clock signal CK is low.

At a time T16, the clock signal CK goes high to inhibit the clocked invertor I12 from the invertor operation again while the clocked invertor I14 starts an invertor operation so that the feedback circuit formed by the clocked invertor I14 and the invertor I13 defines the hold part of the LL circuit for maintaining the state of the output data DOUT corresponding to the input data DIN captured during the invertor operation of the clocked invertor I12, i.e., the state D3.

Operations of the LH circuit are now described with reference to FIG. 7B.

At a time T21, the input data DIN changes to D1, and the clocked invertor I22 operates as an invertor to capture and invert the input data D1 since the clock signal CK is high.

Further, the invertor I25 inverts the output of the clocked invertor I22, and the LH circuit outputs D1 as the output data DOUT.

At a time T22, the clock signal CK goes high to inhibit the invertor operation of the clocked invertor I22 as well as capture of the input data DIN. The clocked invertor I24 operates as an invertor in place, so that a feedback circuit formed by the clocked invertor I24 and the invertor I23 defines a hold part of the LH circuit for maintaining the state of the output data DOUT corresponding to the input data DIN captured during the invertor operation of the clocked invertor I22, i.e., the state D1. Therefore, the output data DOUT remains in the state D1 although the input data DIN changes from D1 to D2 at a time T23.

At a time T24, the clock signal CK goes low and the clocked invertor I22 starts an invertor operation again to capture the input data DIN already changing to D2.

At the same time, the clocked invertor I24 is inhibited from the invertor operation and the feedback of the hold part is interrupted. Therefore, the output data DOUT changes to D2 in response to the input data D2.

At a time T25, the input data DIN changes to D3, and the clocked invertor I22 captures this data and the output data DOUT changes to D3 since the clock signal CK is low.

At a time T26, the clock signal CK goes high to inhibit the invertor operation of the clocked invertor I22 again while the clocked invertor I24 starts an invertor operation so that the feedback circuit formed by the clocked invertor I24 and the invertor I23 defines the hold part of the LH circuit for maintaining the state of the output data DOUT corresponding to the input data DIN captured during the invertor operation of the clocked invertor I22, i.e., the state D3.

Figure 8:
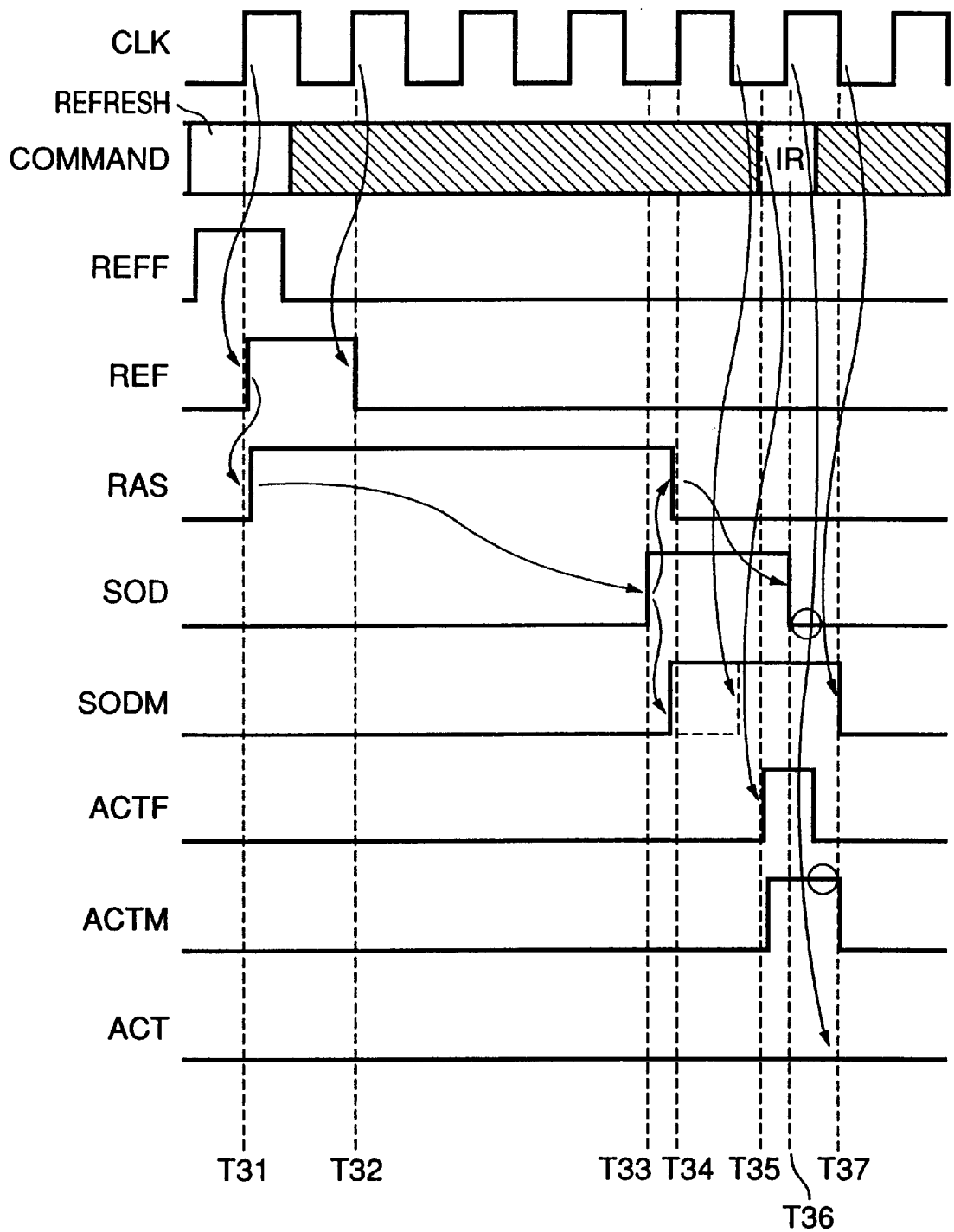
FIG. 8 is a timing chart showing operations of the SDRAM according to the first embodiment of the present invention shown in FIG. 1.
Figure 12:
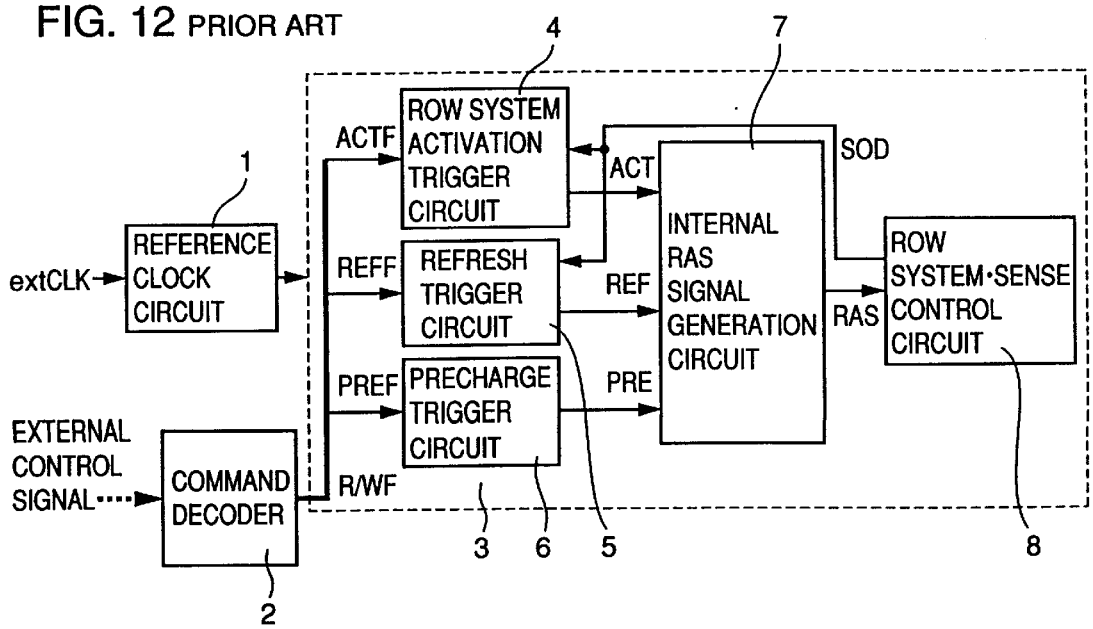
FIG. 12 is a block diagram showing a circuit structure for row system control in a conventional SDRAM.
Figure 13:
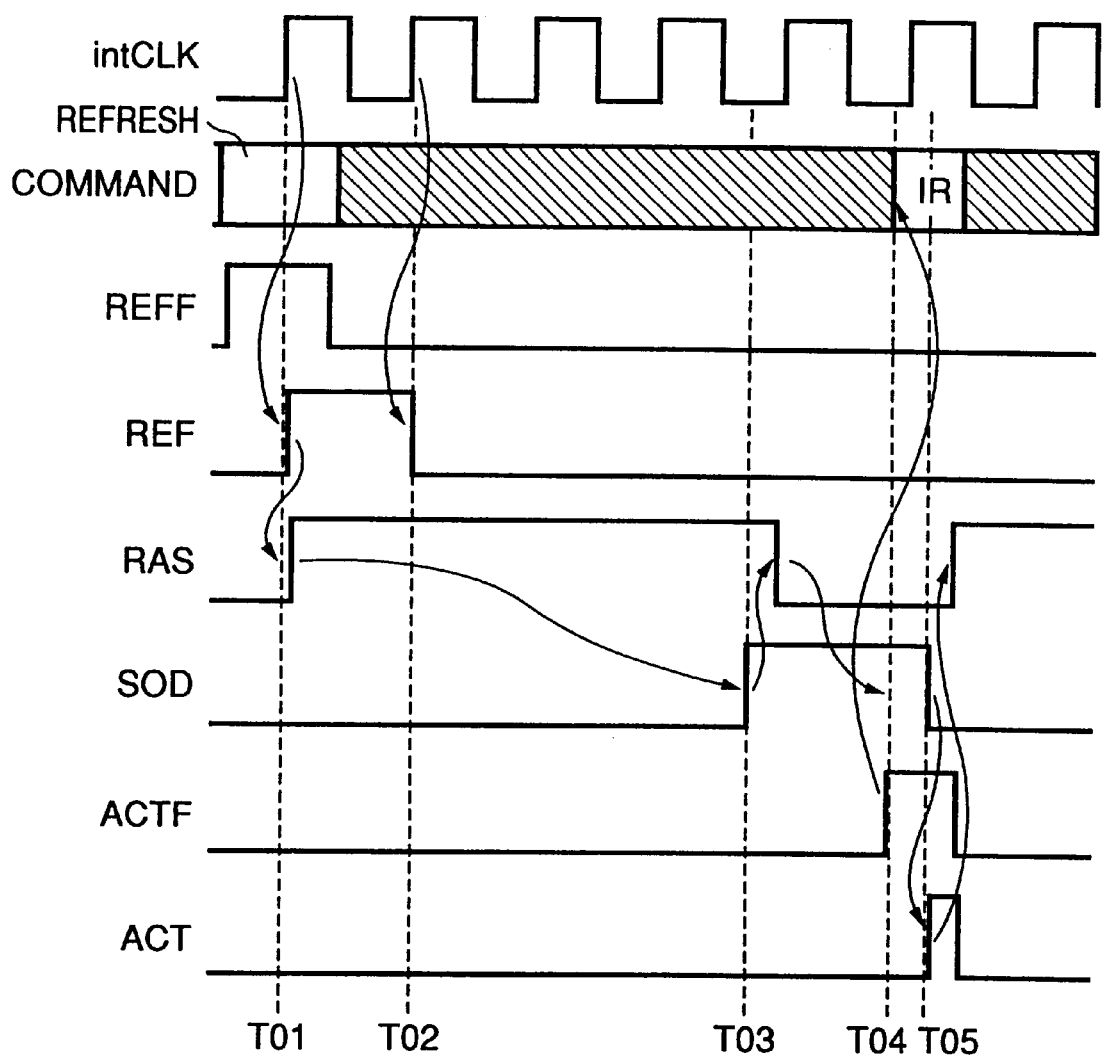
FIG. 13 is a timing chart showing operations of the conventional SDRAM.
Figure 10:
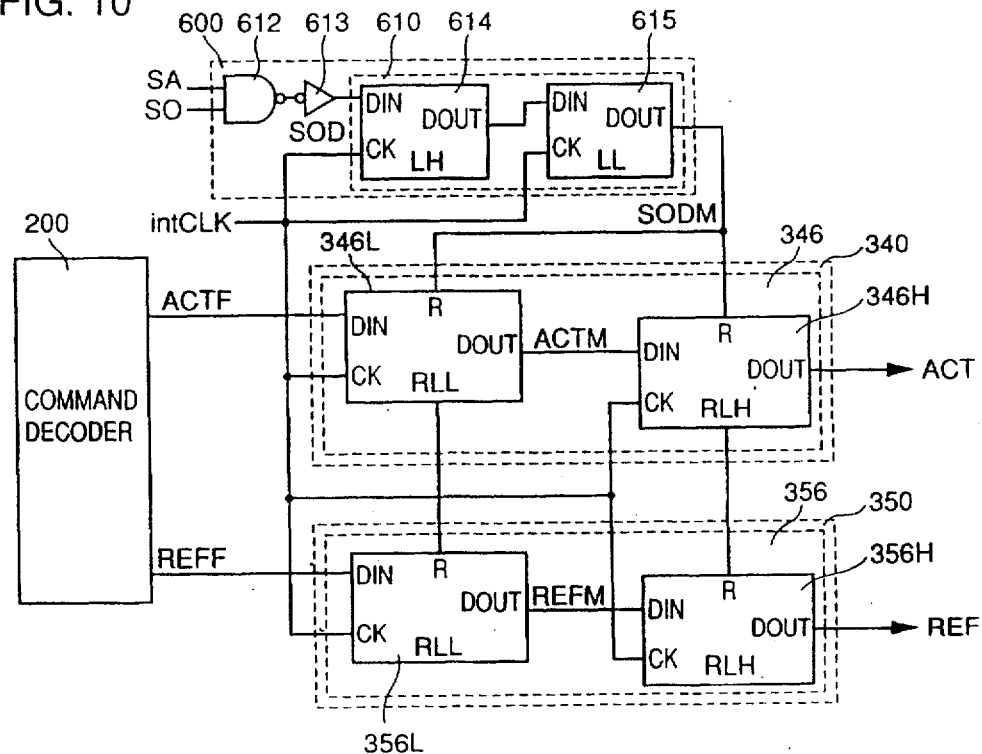
Figure 10:
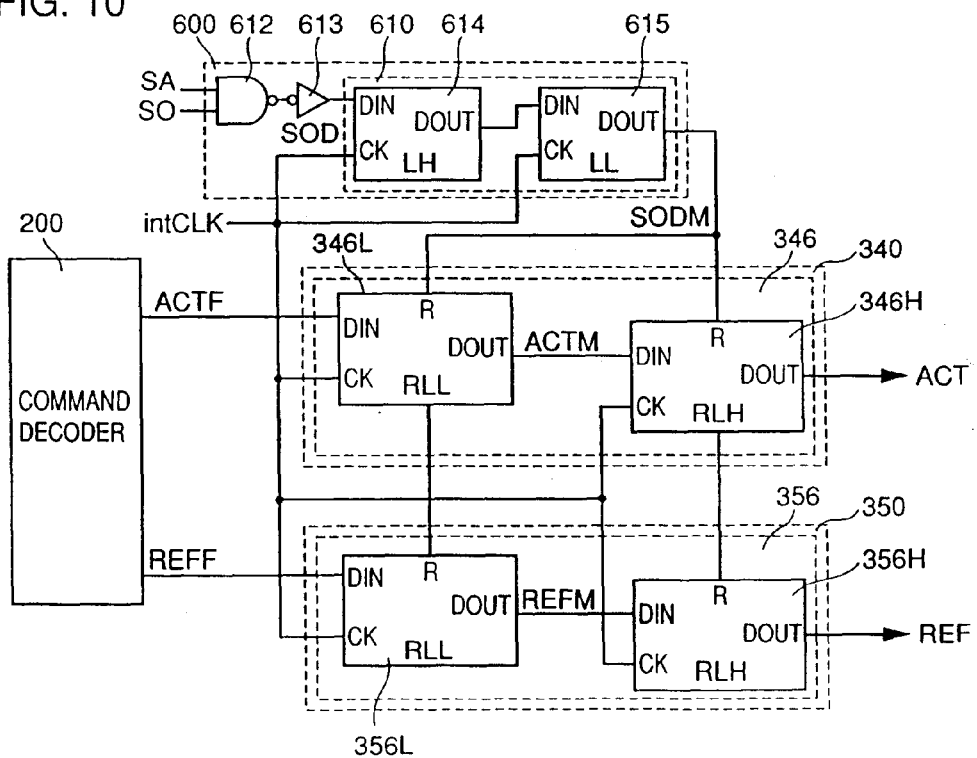

FIG. 8 is a timing chart showing operations of the first embodiment. Referring to FIG. 8, the synchronous semiconductor memory device executes the refresh operation in response to an external refresh command at a timing similar to that shown in FIG. 12, a false row system activation command IR (illegal command) is externally input immediately before termination of the precharge period during the refresh operation, and this time overlaps with rise of the internal reference clock signal intCLK.

Change of the internal reference clock signal intCLK from a low level to a high level is hereinafter referred to as rise, and change from a high level to a low level is hereinafter referred to as fall.

With rise of the internal reference clock signal intCLK at a time T31, the LL circuit 351 in the refresh trigger circuit 350 holds a high level of the refresh command decode signal REFF previously decoded by the refresh command decoder 220 in the command decoder 200 and the RLH circuit 352 captures its output, while the refresh trigger signal REF goes high. In response to the change of the refresh trigger signal REF to the high level, the output of the NOR circuit 372 in the internal RAS signal generation circuit 370 goes low and the internal row system basic signal RAS output from the two-input NAND circuit 373 receiving the output of the NOR circuit 372 is activated high.

When the signal RAS goes high, its data is input in the logic circuit 377 through the RLL circuit 374 and the RLH circuit 375, and hence the output of the logic circuit 377 goes low and is input in the NAND circuit 373.

In short, the high level of the row system basic signal RAS is held.

With rise of the internal reference clock signal intCLK at a time T32, the refresh trigger signal REF goes low and the output of the NOR circuit 372 goes high, while the row system basic signal RAS remains high since the output of the logic circuit 377, which is the second input of the NAND circuit 373, is low.

On the other hand, the row system•sense control circuit 410 receives the change of the signal RAS to the high level at the time T31 for activating the activation instruction signal RDE of the row selection circuit 520 while activating the sense amplifier activation signals S0P and S0N after a lapse of a delay time defined by the asynchronous delay circuit 415.

At a time T33, the asynchronous delay circuit 418 included in the row system•sense control circuit 410 further delays the sense amplifier activation signals S0P and S0N to complete sensing while the signal S0D instructing starting of automatic precharge goes high. In response to this rise of the signal S0D, the LL circuit 611 of the trigger output inhibit circuit 600 captures the high level of the automatic precharge signal S0D. Hence, the inhibit signal S0DM output from the trigger output inhibit circuit 600 goes high in response to the rise of the signal S0D.

The period between activation of the signal RAS and the time T33 corresponds to the delay time defined by the asynchronous delay circuits 415, 416 and the like included in the row system•sense control circuit 410 in the asynchronous control circuit 400.

The output of the NAND circuit 371 goes low in response to the change of the automatic precharge signal S0D to the high level and the output of the invertor 371I receiving this output goes high, and hence the RLL circuit 374 and the RLH circuit 375 are reset regardless of the level of the internal reference clock signal intCLK.

In other words, both outputs of the RLL circuit 374 and the RLH circuit 375 go high and the output of the logic circuit 377 also goes high, whereby the output of the NAND circuit 373, i.e., the internal row system basic signal RAS is inactivated low.

At a time T34, the first internal reference clock signal intCLK after activation of the automatic precharge signal S0D goes high.

At a time T35, the illegal row system activation command IR is input.

The row system activation command decoder 210 receives and decodes this command IR, and the row system activation decode signal ACTF goes high.

In response to this, further, the output of the LL circuit 341 in the row system activation trigger circuit 340 goes high and is input in the RLH circuit 342. However, the inhibit signal S0DM is input in the RLH circuit 342 from the trigger output inhibit circuit 600 as the reset signal R, and hence the row system activation trigger signal ACT does not go high.

At a time T36, the automatic precharge signal S0D asynchronously goes low in consideration of the internal precharge execution period.

However, the internal reference clock signal intCLK is high at this time, and hence the inhibit signal S0DM from the inhibit circuit 600 remains high. In other words, activation of the row system activation trigger signal ACT is left inhibited. Hence, neither goes the row system activation trigger signal ACT high nor is the row system basic signal RAS activated again.

The period between the time T33 and the time T36 is a previously estimated precharge execution period, i.e., a time required for inactivating the word line and completing equalization of the pair of bit lines, which is ensured by the asynchronous delay circuits 415, 416, 418 and the like.

At a time T37, the inhibit signal S0DM goes low synchronously with fall of the internal reference clock signal intCLK, and the row system activation trigger circuit 340 is enabled to output a signal, i.e., enabled for activation again.

In short, the inhibit signal S0DM corresponds to a signal converted to be synchronous with fall of the asynchronous automatic precharge signal S0D.

In the semiconductor memory device according to the first embodiment of the present invention, as hereinabove described, the conversion circuit 610 converts the asynchronous automatic precharge signal S0D to the synchronous signal S0DM for inhibiting trigger output of the trigger circuit 340 with the converted signal S0DM even if a command contributing to row system activation such as a row system activation command is input as an illegal command immediately before termination of precharge. Therefore, it is possible to prevent data destruction or a malfunction of the row system basic signal RAS caused by the illegal command not only during the precharge period but also immediately before termination of the precharge operation between the times T35 and T36 and in superposition on the rise timing of the internal reference clock signal intCLK.

While a row system activation command is input as the illegal command in the first embodiment, the conversion circuit 610 converts the asynchronous automatic precharge signal S0D to the synchronous signal S0DM for inhibiting trigger output of the trigger circuit 340 with the converted signal S0DM also when a refresh command is input as the illegal command. Therefore, it is possible to prevent data destruction or a malfunction of the row system basic signal RAS caused by the illegal command not only during the precharge period but also immediately before termination of the precharge operation and in superposition on the rise timing of the internal reference clock signal intCLK.

Second Embodiment

Figure 9:
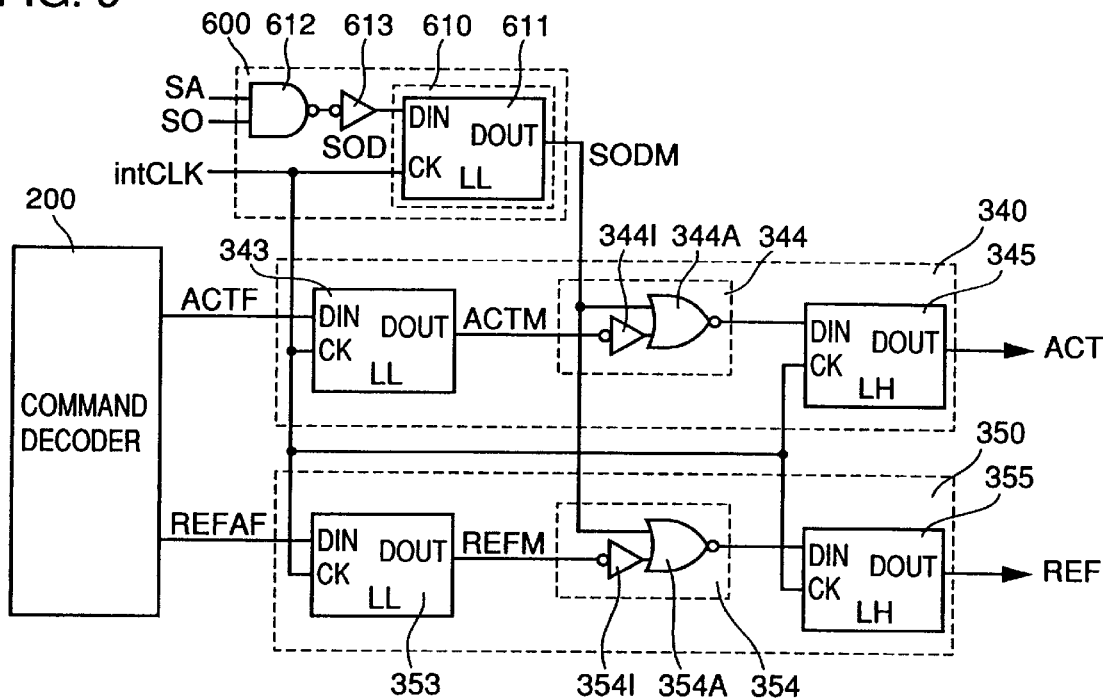
FIG. 9 is a block diagram showing the structures of a command decoder, a row system activation trigger circuit, a refresh trigger circuit and a trigger output inhibit circuit according to a second embodiment of the present invention.

FIG. 9 is a block diagram showing the structures of a row system activation trigger circuit 340, a refresh trigger circuit 350 and a trigger inhibit circuit 600 according to a second embodiment of the present invention.

The second embodiment is different from the first embodiment in the structures of the row system activation trigger circuit 340 and the refresh trigger circuit 350. This difference is now described.

The row system activation trigger circuit 340 includes an LL circuit 343 receiving a row activation decode signal ACTF from a command decoder 200 as an input DIN and an internal reference clock signal intCLK as a clock signal CK and outputting an output signal ACTM, a logic circuit 344 receiving the output signal ACTM from the LL circuit 343 and an inhibit signal S0DM and ignoring change of the signal ACTM when the inhibit signal S0DM is high, and an LH circuit 345 receiving an output of the logic circuit 344 as an input DIN and the internal reference clock signal intCLK as a clock signal CK and outputting a row system activation trigger signal ACT.

The logic circuit 344 is formed by an invertor 344I inverting and outputting the output signal ACTM from the LL circuit 344 and a NOR circuit 344A receiving the output of the invertor 344I and the inhibit signal S0DM, for example.

The refresh trigger circuit 350 includes an LL circuit 353 receiving a refresh decode signal REFF from the command decoder 200 as the input DN and the internal reference clock signal intCLK as a clock signal CK and outputting an output signal REFM, a logic circuit 354 receiving the output signal REFM from the LL circuit 353 and the inhibit signal S0DM and ignoring change of the signal REFM when the inhibit signal S0DM is high, and an LH circuit 355 receiving the signal REFM as an input DIN and the internal reference clock signal intCLK as a clock signal CK and outputting a refresh trigger signal REF.

The logic circuit 354 is formed by an invertor 354I inverting and outputting the output signal REFM from the LL circuit 353 and a NOR circuit 354A receiving the output of the invertor 354I and the inhibit signal S0DM, for example.

In the row system activation trigger circuit 340 and the refresh trigger circuit 350 according to the second embodiment, the logic circuits 344 and 354 prevent an illegal command IR decoded by the command decoder 200 and further captured by the LL circuits 343 and 353 from transmission to the LH circuits 354 and 355 when the inhibit signal S0DM is high.

In a semiconductor memory device according to the second embodiment, as hereinabove described, a conversion circuit 610 converts an asynchronous automatic precharge signal S0D to the synchronous signal S0DM and the logic circuits 344 and 345 in the trigger circuits 340 and 350 inhibit trigger output when the converted signal S0DM is activated even if a command contributing to row system activation such as a row system activation command or a refresh command is input as an illegal command immediately before termination of precharge. Therefore, it is possible to prevent data destruction or a malfunction of a row system basic signal RAS caused by the illegal command not only during a precharge period but also immediately before termination of a precharge operation and in superposition on a rise timing of the internal reference clock signal intCLK.

Third Embodiment

Figure 10:
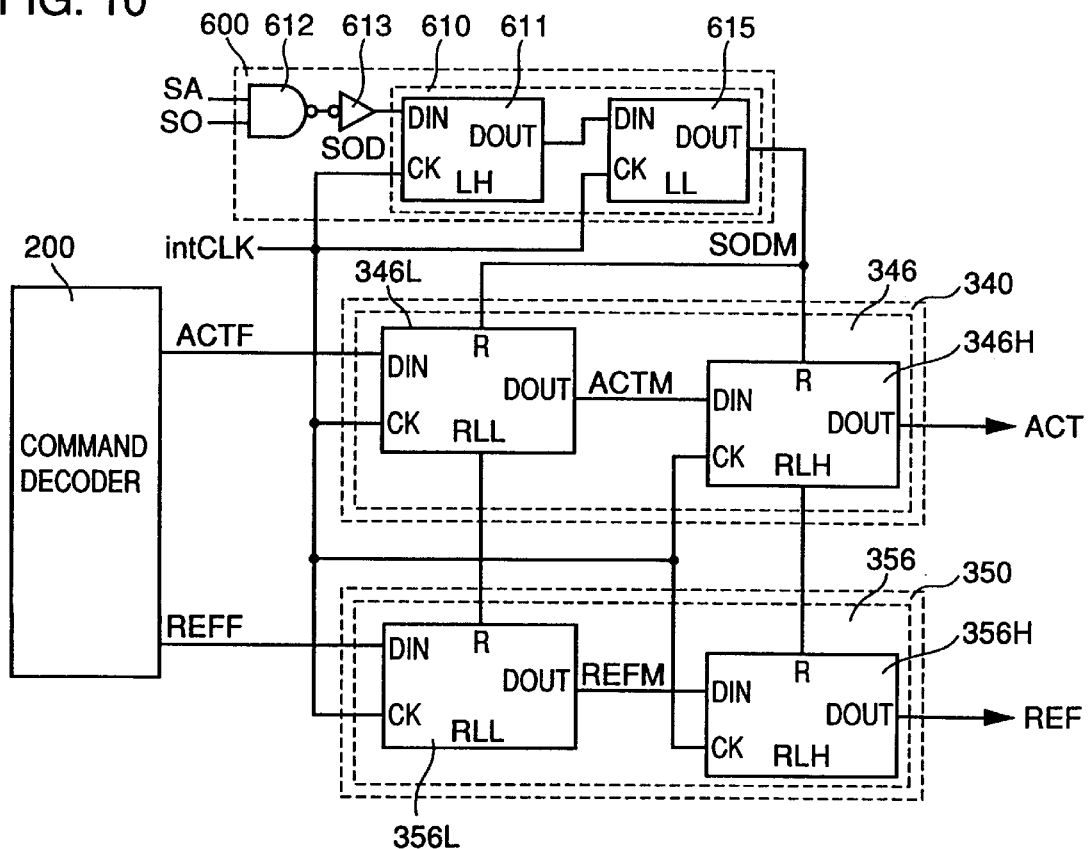
FIG. 10 is a block diagram showing the structures of a command decoder, a row system activation trigger circuit, a refresh trigger circuit and a trigger output inhibit circuit according to a third embodiment of the present invention.

FIG. 10 is a block diagram showing the structures of a row system activation trigger circuit 340, a refresh trigger circuit 350 and a trigger inhibit circuit 600 according to a third embodiment of the present invention.

The third embodiment is different from the first and second embodiments in the structures of the row system activation trigger circuit 340, the refresh trigger circuit 350 and a conversion circuit 610 in the trigger inhibit circuit 600. This difference is now described.

The conversion circuit 610 is formed by a flip-flop circuit including an LH circuit 614 receiving a signal S0D from an invertor 613 as an input IN and an internal reference clock signal intCLK as a clock signal CK and an LL circuit 615 receiving an output from the LH circuit 614 as an input IN and the internal reference clock signal intCLK as a clock signal CK. The row system activation trigger circuit 340 includes an RLL circuit 346L receiving a row system activation decode signal ACTF from a command decoder 200 as an input DIN, the internal reference clock signal intCLK as a clock signal CK and an inhibit signal S0DM as the reset signal R and outputting an output signal ACTM, and an RLH circuit 346H receiving the output signal ACTM of the RLL circuit 346L as an input DIN, the internal reference clock signal intCLK as a clock signal CK and the inhibit signal S0DM as the reset signal R and outputting a row system activation trigger signal ACT. The RLL circuit 346L and the RLH circuit 346H form the so-called flip-flop circuit 346 having a reset function.

The refresh trigger circuit 350 includes an RLL circuit 356L receiving a refresh decode signal REFF from the command decoder 200 as an input DIN, the internal reference clock signal intCLK as a clock signal CK and the inhibit signal S0DM as the reset signal R and outputting an output signal REFM, and an RLH circuit 356H receiving the output signal REFM of the RLL circuit 356L as an input DIN, the internal reference clock signal intCLK as a clock signal CK and the inhibit signal S0DM as the reset signal R and outputting a refresh trigger signal REF. The RLL circuit 356L and the RLH circuit 356H form the so-called flip-flop circuit 356 having a reset function.

Also in a semiconductor memory device according to the third embodiment, as hereinabove described, the row system activation trigger circuit 340 and the refresh trigger circuit 350 are formed by the flip-flop circuits 346 and 356 having reset functions and the flip-flop circuits 346 and 356 are reset by the inhibit signal S0DM obtained by converting the asynchronous automatic precharge signal S0D to the synchronous signal S0DM by the conversion circuit 610 formed by the flip-flop circuit, whereby it is possible to prevent data destruction, displacement of synchronous operations or a malfunction of a row system basic signal RAS caused by an illegal command not only during a precharge period but also immediately before termination of a precharge operation and in superposition on a rise timing of the internal reference clock signal intCLK. Referring to the timing chart shown in FIG. 8, a waveform of the signal S0DM appearing in dotted lines shows the inhibit signal S0DM synchronous with the internal reference clock signal intCLK in the third embodiment.

Fourth Embodiment

Figure 11:
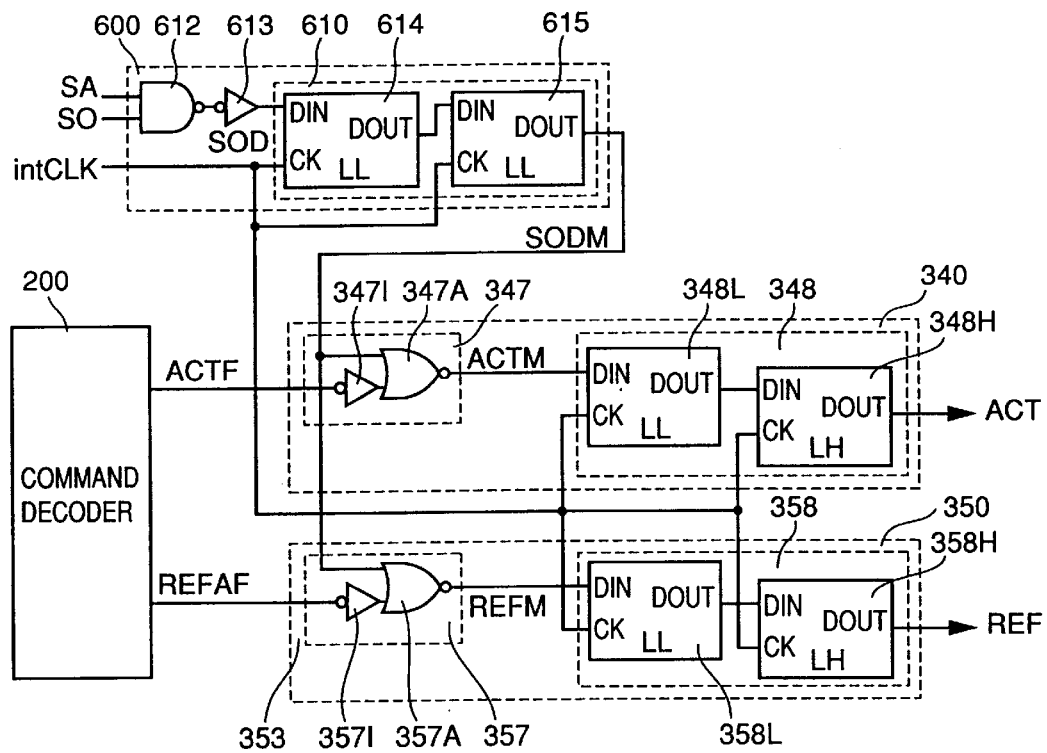
FIG. 11 is a block diagram showing the structures of a command decoder, a row system activation trigger circuit, a refresh trigger circuit and a trigger output inhibit circuit according to a fourth embodiment of the present invention.

FIG. 11 is a block diagram showing the structures of a row system activation trigger circuit 340, a refresh trigger circuit 350 and a trigger inhibit circuit 600 according to a fourth embodiment of the present invention.

The fourth embodiment is different from the third embodiment in the structures of the row system activation trigger circuit 340 and the refresh trigger circuit 350. This difference is now described.

The row system activation trigger circuit 340 includes a logic circuit 347 receiving a row system activation decode signal ACTF from a command decoder 200 and an inhibit signal S0DM from the inhibit circuit 600 and ignoring change of the signal ACTF when the inhibit signal S0DM is high, an LL circuit 348L receiving an output ACTM of this logic circuit 347 as an input DIN and an internal reference clock signal intCLK as a clock signal CK, and an LH circuit 348H receiving an output of the LL circuit 348L as an input DIN and the internal reference clock signal intCLK as a clock signal CK and outputting a row system activation trigger signal ACT. The logic circuit 347 is formed by an invertor 347I inverting and outputting the row system activation decode signal ACTF and a NOR circuit 347A receiving the output of the invertor 347I and the inhibit signal S0DM, for example. The LL circuit 348L and the RLH circuit 348H form the so-called flip-flop circuit 348.

The refresh trigger circuit 350 includes a logic circuit 357 receiving a refresh decode signal REFF from the command decoder 200 and the inhibit signal S0DM from the inhibit circuit 600 and ignoring change of the signal REFF when the inhibit signal S0DM is high, an LL circuit 358L receiving an output REFM of this logic circuit 357 as an input DIN and the internal reference clock signal intCLK as a clock signal CK, and an LH circuit 358H receiving an output of the LL circuit 358L as an input DIN and the internal reference clock signal intCLK as a clock signal CK and outputting a refresh trigger signal REF.

The logic circuit 357 is formed by an invertor 357I inverting and outputting the refresh decode signal REFF and a NOR circuit 357A receiving the output of the invertor 357I and the inhibit signal S0DM, for example. The LL circuit 358L and the RLH circuit 358H form the so-called flip-flop circuit 358.

Also in a semiconductor memory device according to the fourth embodiment, as hereinabove described, the logic circuits 347 and 357 are provided in front of the flip-flop circuits 348 and 358 so that the row system activation decode signal ACTF and the refresh decode signal REFF of an illegal command are not transmitted to the flip-flop circuits 348 and 358 when the inhibit signal S0DM is high. Therefore, it is possible to prevent data destruction, displacement of synchronous operations or a malfunction of a row system basic signal RAS caused by the illegal command not only during a precharge period but also immediately before termination of a precharge operation and in superposition on a rise timing of the internal reference clock signal intCLK.

Also in each of the second, third and fourth embodiments, malfunctions can be prevented when not a row system activation command but a refresh command is input as the illegal command IR.

While each of the above embodiments has been described with reference to the SDRAM 1000, the present invention is also applicable to a semiconductor memory device including a synchronous control circuit and an asynchronous control circuit in combination, particularly a synchronous semiconductor memory device having a plurality of dynamic memory cells, i.e., a synchronous semiconductor memory device including a part generally referred to as a DRAM core.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device comprising:

a reference circuit receiving an external reference clock signal and outputting an internal reference clock signal;

a command decoder outputting a decode signal instructing a prescribed internal operation in response to an external control signal;

a synchronous control circuit receiving said decode signal and said internal reference clock signal and outputting a synchronous control signal activated synchronously with said internal reference clock signal and inactivated in response to an asynchronous control signal;

an asynchronous control circuit for outputting said asynchronous control signal activated asynchronously with said internal reference clock signal, said asynchronous control circuit including an asynchronous delay circuit for generating said asynchronous control signal by delaying said synchronous control signal by a prescribed period;

an inhibit circuit receiving said asynchronous control signal and said internal reference clock signal and converting said asynchronous control signal to be synchronous with said internal reference clock signal thereby generating an inhibit signal inhibiting activation of said synchronous control signal; and a storage circuit controlled in response to said synchronous control signal and said asynchronous control signal for transmitting/receiving stored data to/from outside said synchronous semiconductor memory device.

2. The synchronous semiconductor memory device in accordance with claim 1, wherein said synchronous control circuit includes:

a trigger circuit receiving said decode signal and said internal reference clock signal and outputting a trigger signal triggering said prescribed internal operation, and an internal basic signal generation circuit receiving said trigger signal and outputting said synchronous control signal.

3. The synchronous semiconductor memory device in accordance with claim 2, wherein said inhibit circuit includes:

a hold circuit holding said inhibit signal active in response to activation of both of said internal reference clock signal and said asynchronous control signal and setting said inhibit signal inactive in response to inactivation of both of said internal reference clock signal and said asynchronous control signal.

4. The synchronous semiconductor memory device in accordance with claim 2, wherein said synchronous control circuit further includes:

a trigger disable circuit inhibiting activation of said trigger signal in an active period of said inhibit signal.

5. The synchronous semiconductor memory device in accordance with claim 4, wherein said trigger disable circuit cuts off transmission of said decode signal to said trigger circuit during said active period of said inhibit signal.

6. A synchronous semiconductor memory device comprising:

a plurality of dynamic memory cells arranged in a plurality of rows and a plurality of columns;

a reference clock circuit receiving an external reference clock signal and outputting an internal reference clock signal;

a refresh command decoder outputting a refresh decode signal instructing a refresh operation for said plurality of memory cells in response to an external control signal;

a row system activation command decoder outputting a row system activation decode signal instructing a row system activating operation including row selection of said plurality of memory cells;

a refresh trigger circuit receiving said refresh decode signal and said internal reference clock signal and outputting a refresh trigger signal triggering starting of said refresh operation;

a row system activation trigger circuit receiving said row system activation decode signal and said internal reference clock signal and outputting a row system activation trigger signal triggering starting of a row system activating operation;

an internal row system basic signal generation circuit receiving said refresh trigger signal and said row system activation trigger signal and outputting an internal row system basic signal activated in response to activation of at least either said refresh trigger signal or said row system activation trigger signal;

an asynchronous control circuit for outputting an asynchronous control signal activated asynchronously with said internal reference clock signal, said asynchronous control circuit including an asynchronous delay circuit for generating said asynchronous control signal by delaying said internal row system basic signal by a prescribed period; and a trigger output inhibit circuit inhibiting activation of said refresh trigger signal and said row system activation trigger signal in response to an active state of a signal obtained by converting said asynchronous control signal to be synchronous with said internal reference clock signal in said refresh operation.

7. The synchronous semiconductor memory device in accordance with claim 6, wherein said trigger output inhibit circuit includes:

a conversion circuit receiving said asynchronous control signal and said internal reference clock signal and converting said asynchronous control signal to a converted signal synchronized with said internal reference clock signal in said refresh operation, and a trigger disable circuit inhibiting activation of said refresh trigger signal and said row system activation trigger signal in response to said converted signal.

8. The synchronous semiconductor memory device in accordance with claim 7, wherein said asynchronous control signal is an automatic precharge signal in said refresh operation.

9. The synchronous semiconductor memory device in accordance with claim 7, wherein said conversion circuit includes:

a hold circuit holding said converted signal active in response to activation of both of said internal reference clock signal and said asynchronous control signal and setting said converted signal inactive in response to inactivation of both of said internal reference clock signal and said asynchronous control signal.

10. The synchronous semiconductor memory device in accordance with claim 8, further comprising:

a precharge command decoder outputting a precharge decode signal instructing a precharge operation in response to said external control signal, and a precharge trigger circuit receiving said precharge decode signal and said internal reference clock signal and outputting a precharge trigger signal triggering starting of a precharge operation, wherein said internal row system basic signal generation circuit receives said precharge trigger signal and said automatic precharge signal, and said internal row system basic signal is inactivated in response to said automatic precharge signal in said refresh operation and in response to said precharge trigger signal in a non-refresh operation.

* * * * *

UNITED STATES PATENT AND TRADEMARK OFFICE
CERTIFICATE OF CORRECTION

PATENT NO. : 6,240,045 B1
DATED : May 29, 2001
INVENTOR(S) : Masaru Haraguchi et al.

It is certified that error appears in the above-identified patent and that said Letters Patent is hereby corrected as shown below:

Drawings,
Sheet 7 of 9, FIG. 10, at the top of the figure, change "611" to -- 614 --. The corrected drawing follows:

Signed and Sealed this

Twenty-eighth Day of May, 2002

*Attest:*

JAMES E. ROGAN
*Attesting Officer*     *Director of the United States Patent and Trademark Office*

UNITED STATES PATENT AND TRADEMARK OFFICE
CERTIFICATE OF CORRECTION

PATENT NO. : 6,240,045 B1
DATED : May 29, 2001
INVENTOR(S) : Masaru Haraguchi et al.

It is certified that error appears in the above-identified patent and that said Letters Patent is hereby corrected as shown below:

<u>Drawings,</u>
Sheet 7 of 9, FIG. 10, at the top of the figure, change "611" to -- 614 --. The corrected drawing follows:

This certificate supersedes Certificate of Correction issued May 28, 2002.

UNITED STATES PATENT AND TRADEMARK OFFICE
CERTIFICATE OF CORRECTION

| | | |
|---|---|---|
| PATENT NO. | : 6,240,045 B1 | Page 3 of 3 |
| DATED | : May 29, 2001 | |
| INVENTOR(S) | : Masaru Haraguchi et al. | |

It is certified that error appears in the above-identified patent and that said Letters Patent is hereby corrected as shown below:

Drawings (con't)
Sheet 8 of 9, FIG. 11, near the top of the figure, change "LL" (first occurrence) to
-- LH --. The corrected drawing follows:

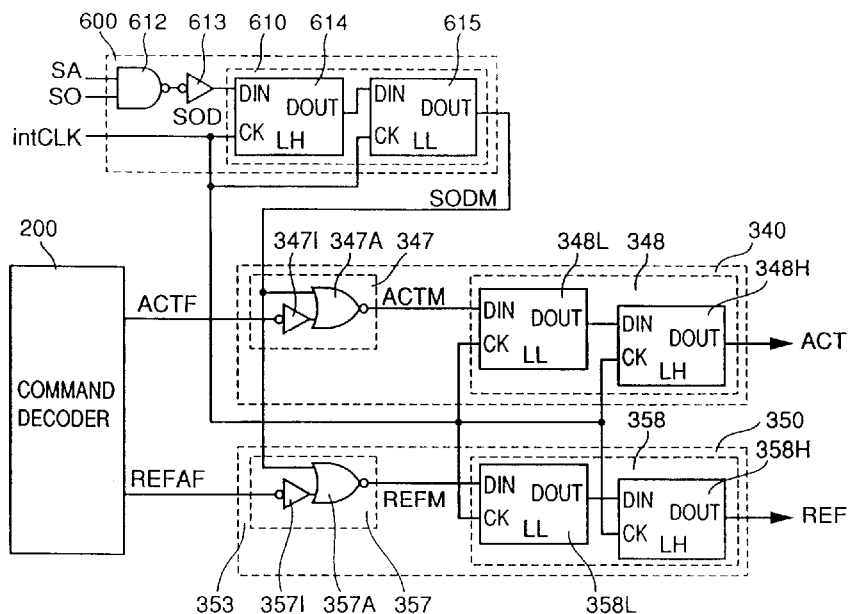

Signed and Sealed this

Thirteenth Day of August, 2002

*Attest:*

*Attesting Officer*

JAMES E. ROGAN
Director of the United States Patent and Trademark Office